(12) United States Patent
Wang

(10) Patent No.: US 8,071,159 B2
(45) Date of Patent: Dec. 6, 2011

(54) METHOD OF MAKING PURE WHITE LIGHT SOURCE

(76) Inventor: Wade Lee Wang, Shulin (TW)

( * ) Notice: Subject to any disclaimer, the term of this patent is extended or adjusted under 35 U.S.C. 154(b) by 449 days.

(21) Appl. No.: 12/382,709

(22) Filed: Mar. 23, 2009

(65) Prior Publication Data

US 2010/0239745 A1  Sep. 23, 2010

(51) Int. Cl.
*B05D 5/06* (2006.01)
(52) U.S. Cl. .......................................... 427/71
(58) Field of Classification Search .................. 427/64, 427/71
See application file for complete search history.

(56) References Cited

U.S. PATENT DOCUMENTS

| 2007/0159064 A1* | 7/2007 | Choi et al. ............. 313/502 |
| 2008/0151527 A1* | 6/2008 | Ueno et al. .............. 362/84 |
| 2009/0176430 A1* | 7/2009 | Wang ..................... 445/50 |

FOREIGN PATENT DOCUMENTS

| JP | 2007-5549 | * 1/2007 |
| WO | WO 2006-131924 | * 12/2006 |

* cited by examiner

*Primary Examiner* — James Lin
(74) *Attorney, Agent, or Firm* — Bacon & Thomas, PLLC

(57) ABSTRACT

The present invention provides a method of making pure white light source. A phosphor powder which at least comprises three elements Zn, Se, and O is used for being excited by a purple-LED to emit pure red light (650 nm). The phosphor powder is coated on the purple-LED (Ex. chromaticity coordinate of x:0.26, y:0.10), and then placed aside a pure green-LED (or chip), when the purple-LED and the green-LED are electrified, a pure white light source with high color rendering index and high color saturation is obtained.

3 Claims, 3 Drawing Sheets

METHOD OF MAKING PURE WHITE LIGHT SOURCE

FIELD OF THE INVENTION

The present invention relates to a method of making pure white light source, and more particularly to a phosphor powder comprising at least three elements Zn, Se, O which can be excited by a purple-LED to emit pure red light, and then cooperated with the purple-LED and a green-LED (or chip) to generate a pure white light source with high color rendering index and high color satuaration.

BACKGROUND OF THE INVENTION

Since 1996 Nichia Corporation in Japan had developed a blue-LED to excite a phosphor powder to emit yellow light, then the blue light and the yellow light are mixed to produce a white light with high intensity. This development begins the era of white-LED application.

A white light is composed of different color lights. At least two color lights with different wavelength are required to be mixed so as to make human eyes to feel as a white light. For example, red, blue and green lights, or blue and yellow lights can be mixed to make human eyes feel as a white light. According to this principle, a white-LED can be designed.

Conventional white light of three wavelengths requires at least three different phosphor powders in order to have high color rendering index. Three different phosphor powders must have the same ability to absorb the exciting light, the absorbing coefficients of the three phosphor powders have to be nearly the same, and the quantum efficiency of energy conversion of the three different phosphor powders must be as close as possible, the proportion between the three different phosphor powders must be adjusted carefully to get an ideal white light. However, it is difficult to choose three kinds of phosphor powders described as above.

Furthermore, the specific gravity, the granule size and the luminescent efficiency of the three different phosphor powders are not the same, and thus uniformly mixing of three different phosphor powders is not easy. Mass production requires classified inspection for correlated color temperature, color rendering index and chromaticity coordinate, therefore it causes low yield. In addition, multiple phosphor powders have the problem of mutual interference so as to lower the luminescent efficiency thereof as compared with mono phosphor powder. Up to the present, it is seldom for conventional white-LED to use multiple phosphor powders to cooperate with an LED chip to emit white light.

In a mono phosphor powder system, the main design is using a blue-LED to cooperate with a yellow phosphor powder (YAG or TAG) to generate a white light. The disadvantages thereof are the higher correlated color temperature that causes uncomfortableness for human eyes and weaker red light that causes low color rendering index (70~80) and low color saturation.

Recently, LED goes forward to the application of backlight source for LCD monitor and lighting. The International Commission on Illumination (CIE) sets up a standard that a light source with color rendering index 80~90 is suitable for indoor lighting. Therefore a blue chip cooperated with a yellow phosphor powder (YAG or TAG) is not suitable for indoor lighting.

Moreover, the backlight source used for LCD monitor requires high color saturation. The ideal proportion of luminescent energy between red light (650 nm), green light (525 nm) and blue light (450 nm) is 1:1:1 so as to generate a variety of colors for real perfect appearance of pictures. However, a blue-LED to cooperate with a yellow phosphor powder just achieves a proportion of luminescent energy between red light, green light and blue light by 0.4:0.6:1.0, which is not suitable as a good backlight source for LCD monitor use.

Currently, a white LED of backlight source for LCD monitor uses three chips of red, green, blue, but more chips causes more costs. The red chip decays faster than blue chip and green chip. When the temperature of the backlight source increases, the red light decays 23%, while green light and blue light decays 7%, thus the color saturation becomes poor, and then lose real perfect appearance of pictures.

SUMMARY OF THE INVENTION

The object of the present invention is to provide a method of making pure white light source, comprises steps of:
  a. prepare a phosphor powder comprising at least three elements Zn, Se, and O;
  b. coating the phosphor powder on a purple-LED;
  c. a green-LED (or chip) is placed aside the purple-LED;
  d. when the purple-LED and green-LED (or chip) are electrified, a pure white light source with high color rendering index and high color saturation is obtained;

High purity (99.99% or above) ZnSe powder is heated in a furnace having atmosphere with oxygen, and then quenched rapidly to form the phosphor powder; the phosphor powder being excited by the purple-LED emits pure red light (650 nm); the phosphor powder is mixed with a suitable amount of an adhesive which does not react with the phosphor powder so as to be coated on the purple-LED.

DETAILED DESCRIPTION OF THE PREFERRED EMBODIMENTS

High purity (99.99% or above) ZnSe powder is used to form the phosphor powder of the present invention by conventional solid-state reaction method. The steps are described as below:

The ZnSe powder is placed in a platinum crucible, a furnace having atmosphere with oxygen is maintained at 1000~1000° C., put the platinum crucible into the furnace for heating, and then take out the platinum crucible for quenching rapidly to form the phosphor powder of $ZnSe_xO_{1-x}$ (x: 0~1) which can be excited by a purple-LED to emit pure red light (650 nm). The quenching can be done by putting the platinum crucible on an iron plate or putting it into water. The best luminescent efficiency of the phosphor powder is obtained by adjusting the time of heating and controlling the flow rate of oxygen.

Figure 1:
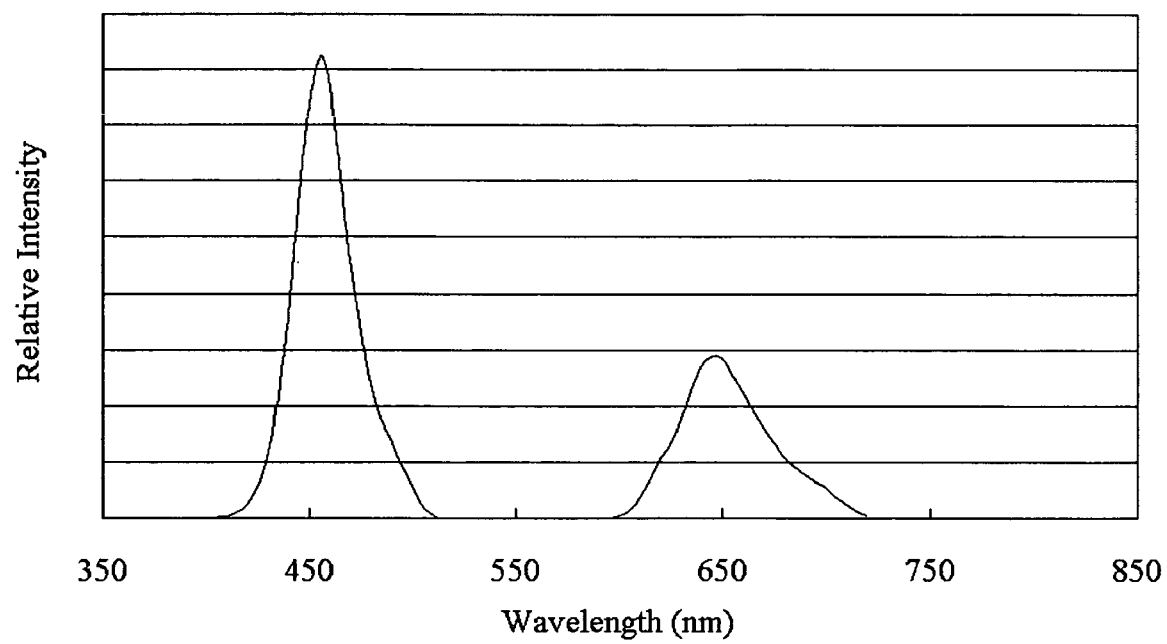
FIG. 1 shows the emission spectrum of the purple-LED according to the present invention.

The emission spectrum of the purple-LED used for the present invention is shown in FIG. 1.

A green-LED of surface mounting style is placed aside the purple-LED of surface mounting style. The arrangement is to let each green-LED match with a purple-LED to form a matrix. A suitable amount of air-setting resin (such as polyvinylacetate PVAC) which does not react with the phosphor powder is adopted for mixing with the phosphor powder $ZnSe_xO_{1-x}$ (x: 0~1), and then coated on the surface of a purple-LED. The purple-LED emits light with a chromaticity coordinate around x: 0.23~0.27, y: 0.06~0.16. The green-LEDs and the purple-LEDs are electrically connected parallelly respectively, and then electrified by a current of 80~100 Hz, the green-LEDs are connected serially with a variable resistor, a pure white light source of high color rendering index and high color saturation is therefore obtained by adjusting the resistance of the variable resistor.

Another embodiment of the present invention is to let a green-LED and a purple-LED to be packaged as a single LED, and then let the phosphor powder to be coated on the surface of the single LED.

The characteristic of the present invention is to use a phosphor powder comprising at least three elements Zn, Se and O which can be excited by the light of the purple-LED to emit pure red light, coat the phosphor powder on the surface of the purple-LED, and then place a green-LED aside the purple-LED to generate a high color saturation white light source with high color rendering index over 90, this light contains red light 650 nm, green light 525 nm, blue light 450 nm.

Figure 2:
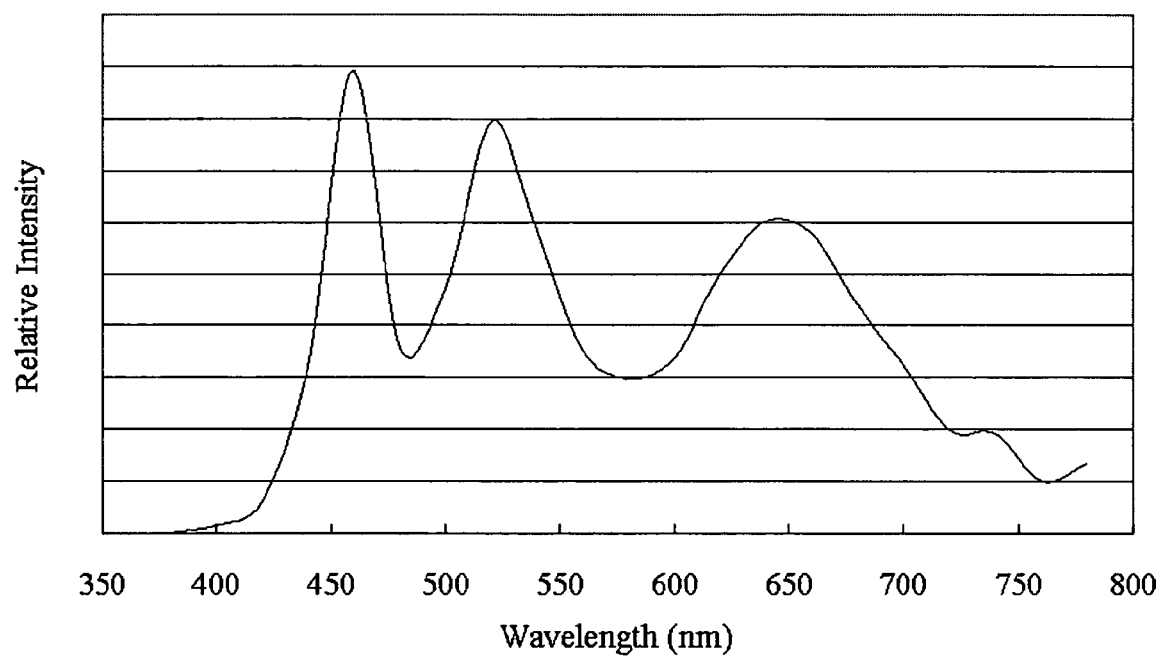
FIG. 2 shows the emission spectrums of the pure white light source using a purple-LED that contains red light 650 nm according to the present invention.
Figure 3:
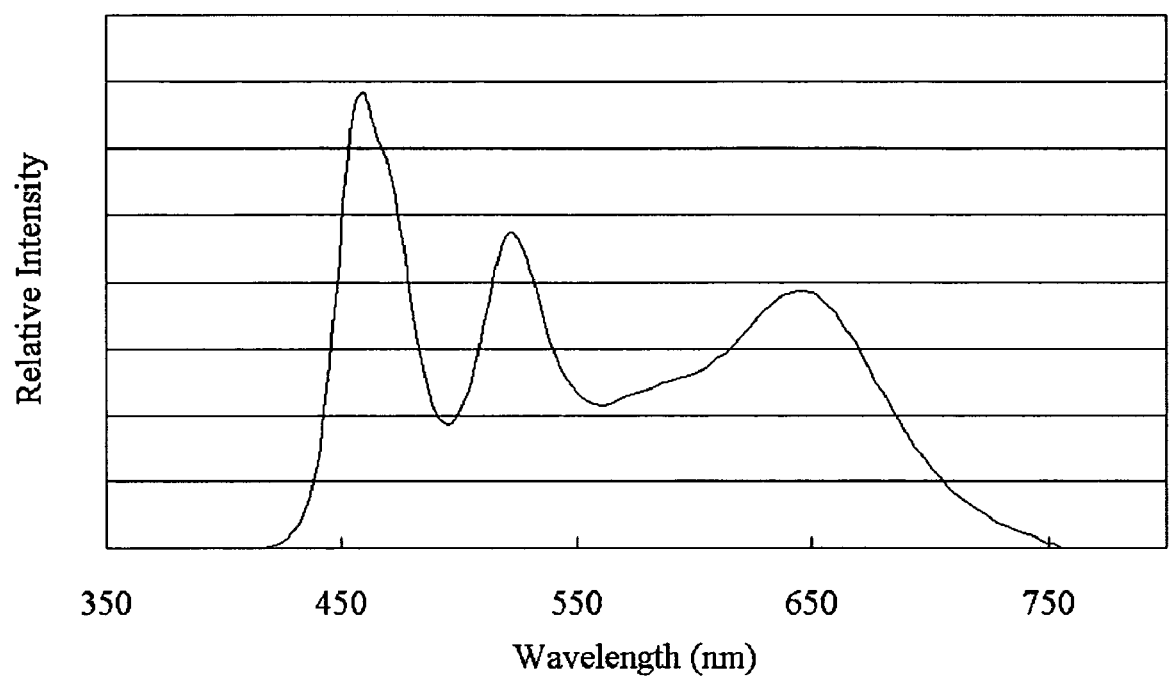
FIG. 3 shows the emission spectrums of the pure white light source using a purple-LED that contains red light 600 nm according to the present invention.

The emission spectrum of the pure white light source according to the present invention is shown in FIG. 2 and FIG. 3. The two different emission spectrums result from using different kinds of purple-LED. The purple-LED of FIG. 2 contains red light 650 nm, and the purple-LED of FIG. 3 contains red light 600 nm.

The method of making pure white light source according to the present invention has special features as described below:

(1) Since the present invention uses phosphor powder having pure red light 650 nm, and cooperates with the blue light 450 nm of the purple-LED and the green light 525 nm of the green-LED, a pure white light of high color saturation with uniform three primary colors is easily generated.

(2) Since the phosphor powder having pure red light 650 nm is used to replace common red LED of reddish orange light 625 nm, a better harmonious color result is achieved.

(3) The phosphor powder emitting pure red light for generating the white light source of the present invention does not have the problem of rapid decay in intensity when temperature increases, so a stable and pure white light source is achieved.

(4) The phosphor powder used by the present invention for generating a pure white light source is very easy to prepare and cost-effective. The accuracy and reproductvity of the emission spectrum is very good for mass production of a white light source with high color rendering index and high color saturation.

(5) The white light source of the present invention has a color rendering index higher than 80, which is comply with the CIE standard of indoor lighting. In addition, since the white light source of the present invention is mixed by pure blue, pure red and pure green lights, the harmonious color range is very broad, there is no need for color filter, and it is suitable for backlight requirements of high quality LCD television.

The scope of the present invention depends upon the following claims, and is not limited by the above embodiments.

What is claimed is:

1. A method of making pure white light source, comprises steps of:
   a. prepare a phosphor powder comprising at least three elements Zn, Se, and O;
   b. coating the phosphor powder on a purple-LED, wherein the phosphor powder being excited by the purple-LED emits pure red light;
   c. a green-LED (or chip) is placed aside the purple-LED;
   d. when the purple-LED and green-LED (or chip) are electrified, a pure white light source with high color rendering index, and high color saturation is obtained.

2. The method of making pure white light source according to claim 1, further comprises: high purity (99.99% or above) ZnSe powder is heated in a furnace having atmosphere with oxygen, and then quenched rapidly to form the phosphor powder.

3. The method of making pure white light source according to claim 1, wherein the phosphor powder is mixed with a suitable amount of an adhesive which does not react with the phosphor powder so as to be coated on the purple-LED.

* * * * *